US011340979B2

(12) United States Patent
Aklik et al.

(10) Patent No.: US 11,340,979 B2
(45) Date of Patent: May 24, 2022

(54) MITIGATION OF SOLID STATE MEMORY READ FAILURES WITH A TESTING PROCEDURE

(71) Applicant: Seagate Technology LLC, Cupertino, CA (US)

(72) Inventors: Mehmet Emin Aklik, Edina, MN (US); Antoine Khoueir, Shakopee, MN (US); Darshana H. Mehta, Shakopee, MN (US); Nicholas Lien, Shakopee, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 345 days.

(21) Appl. No.: 16/729,237

(22) Filed: Dec. 27, 2019

(65) Prior Publication Data

US 2021/0200623 A1    Jul. 1, 2021

(51) Int. Cl.
| | |
|---|---|
| *G06F 11/07* | (2006.01) |
| *G11C 29/08* | (2006.01) |
| *G06F 11/10* | (2006.01) |
| *G11C 29/52* | (2006.01) |
| *G11C 29/00* | (2006.01) |

(52) U.S. Cl.
CPC ........ *G06F 11/0793* (2013.01); *G06F 11/076* (2013.01); *G06F 11/0727* (2013.01); *G06F 11/1068* (2013.01); *G11C 29/08* (2013.01); *G11C 29/52* (2013.01); *G11C 29/883* (2013.01)

(58) Field of Classification Search
CPC ............. G06F 11/0727; G06F 11/0754; G06F 11/076; G06F 11/0793; G06F 11/1666; G11C 29/08; G11C 29/10; G11C 29/44; G11C 29/4401; G11C 29/52; G11C 29/70; G11C 29/88; G11C 29/883
See application file for complete search history.

(56) References Cited

U.S. PATENT DOCUMENTS 6,014,755 A      1/2000  Wells et al.
6,216,248 B1 *   4/2001  Mc Connell ........ G06F 11/1008
                                                           714/746

(Continued)

FOREIGN PATENT DOCUMENTS

DE           19829234 A1 *  1/1999  .......... G06F 11/1008

*Primary Examiner* — Gabriel Chu
(74) *Attorney, Agent, or Firm* — Holzer Patel Drennan

(57) ABSTRACT

Read error mitigation in solid-state memory devices. A solid-state drive (SSD) includes a read error mitigation module that monitors one or more memory regions. In response to detecting uncorrectable read errors, memory regions of the memory device may be identified and pre-emptively retired. Example approaches include identifying a memory region as being suspect such that upon repeated read failures within the memory region, the memory region is retired. Moreover, memory regions may be compared to peer memory regions to determine when to retire a memory region. The read error mitigation module may trigger a test procedure on a memory region to detect the susceptibility of a memory region to read error failures. By detecting read error failures and retirement of a memory regions, data loss and/or data recovery processes may be limited to improve drive performance and reliability.

20 Claims, 6 Drawing Sheets

(56) References Cited

U.S. PATENT DOCUMENTS

| | | | |
|---|---|---|---|
| 8,312,349 B2 * | 11/2012 | Reche | G06F 11/0793 |
| | | | 714/773 |
| 8,411,519 B2 | 4/2013 | Byom et al. | |
| 8,683,298 B2 | 3/2014 | Reche et al. | |
| 9,389,937 B2 * | 7/2016 | Ackaret | G06F 11/0754 |
| 9,778,985 B1 * | 10/2017 | Kim | G06F 3/064 |
| 10,387,281 B2 | 8/2019 | Singidi et al. | |
| 10,437,512 B2 | 10/2019 | Zhu et al. | |
| 2008/0307270 A1 * | 12/2008 | Li | G06F 11/1068 |
| | | | 714/47.2 |
| 2011/0047421 A1 | 2/2011 | Schuette | |
| 2016/0162196 A1 | 6/2016 | Camp et al. | |
| 2017/0269980 A1 | 9/2017 | Gupta et al. | |
| 2017/0294237 A1 * | 10/2017 | Li | G11C 29/76 |
| 2018/0189154 A1 * | 7/2018 | Zhu | G06F 11/0727 |
| 2018/0366209 A1 * | 12/2018 | Mehta | G11C 29/42 |
| 2019/0065331 A1 * | 2/2019 | Singidi | G06F 11/1068 |
| 2020/0409787 A1 | 12/2020 | Yip et al. | |

* cited by examiner

MITIGATION OF SOLID STATE MEMORY READ FAILURES WITH A TESTING PROCEDURE

CROSS-REFERENCE TO RELATED APPLICATIONS

The present application is also related to U.S. patent application Ser. No. 16/729,206 filed DATE Dec. 27, 2019, entitled "MITIGATION OF SOLID STATE MEMORY READ FAILURES" and U.S. patent application Ser. No. 16/729,228 filed DATE Dec. 27, 2019, entitled "MITIGATION OF SOLID STATE MEMORY READ FAILURES WITH PEER BASED THRESHOLDS" both of which are filed concurrently herewith and are specifically incorporated by reference for all that they disclose and teach.

BACKGROUND

Solid state drives (SSDs) are widely used for storage of data. SSDs may include any appropriate solid-state memory technology including flash memory chips. One known failure mode for SSDs includes failure of an SSD during a read operation (also referred to herein as a "read failure"). While error correction codes or other data recovery techniques may be used in the event of a read failure, read failures may ultimately be fatal to an SSD and potentially lead to data loss. Moreover, even when data recovery techniques (e.g., RAID recovery) are employed, such approaches may involve costly reconstruction of data that impair the efficiency of the SSD device.

SUMMARY

In view of the foregoing, the present disclosure generally relates to mitigation of read failures in an SSD. The approaches described herein include approaches that may detect failure of a memory region of a drive preemptively to allow the memory region of the drive that is determined to be failing to be retired such that data is migrated from the failing memory region of the SSD, avoiding data loss or the need to reconstruct large amounts of data.

Specifically, the present disclosure relates to an approach for detection of read errors in a solid-state memory device that may be used to proactively detect failure of the device. The approach may include initiating a test procedure on a memory region (e.g., a die of flash memory) of the solid-state memory device in response to a trigger. In turn, an error correction capability of the solid-state memory device is modified from an operational error correction capability to a test error correction capability. The approach includes detecting an uncorrectable read error based on the test error correction capability and tracking a region read fail metric based on the uncorrectable read errors per memory region. The region read fail metric is compared to an error threshold such that the approach includes determining whether to retire the memory region based on the region read fail metric in relation to the error threshold.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

As discussed above, SSDs are used in many data storage applications for non-volatile storage of data. SSDs are, however, susceptible to read failures in which a read operation fails to be successfully performed on a given portion of SSD memory. Read failures in an SSD are problematic for a number of reasons. For example, while storage devices may be configured to include for data recovery capabilities (e.g., through use of error correction codes, RAID recovery, or other data recovery techniques), deploying data recovery to reconstruct data due to read errors may be inefficient and require computational overhead that detracts from overall storage system performance. Moreover, in extreme cases, SSDs may experience catastrophic data loss that may not be capable of recovery via standard data recovery techniques. In this regard, reactive approaches to read errors on an SSD may negatively affect data retention and storage device performance.

In turn, proactive detection of read failures may be used to retire one or more portions of an SSD (e.g., a page, a block, or a plane). Moreover, memory portions of a memory region (e.g., a die) may be monitored such that a memory region may be identified as a failing region and retired based on the performance of the memory portions within the memory region. The preemptive retirement of memory portions or regions may mitigate the impact of read failures and the potential for data loss or the need to reconstruct data from a failed drive or a failed portion of a die. Mitigation of read failures on an SSD drive may generally include detection of read errors on one or more memory portions of a drive so steps may be taken to retire such portions of the SSD experiencing read failures. In turn, data stored in the failing portion or region of the SSD may be migrated away from the failing portions or region. In turn, the likelihood of data loss may be reduced, and overall drive performance may be improved.

Figure 1:
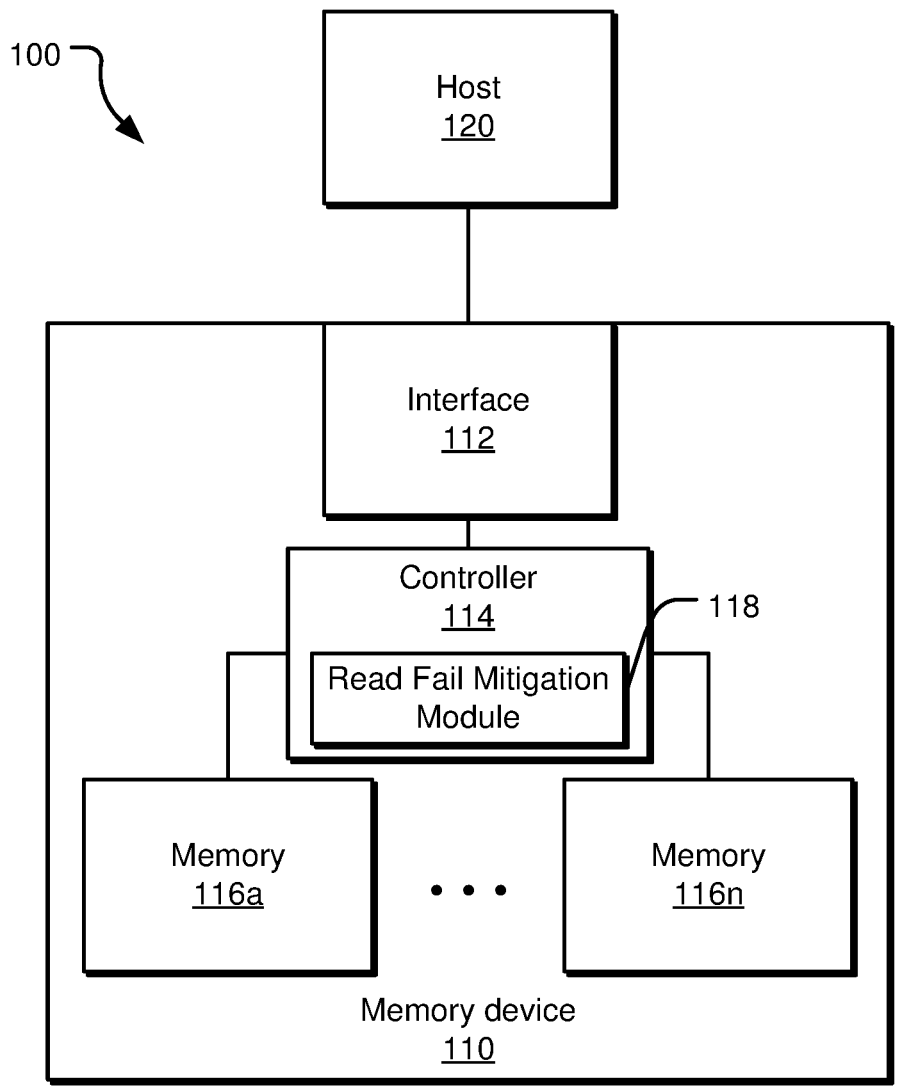
FIG. 1 depicts a schematic drawing of an example storage system 100 in which read error mitigation may be utilized.

With reference to FIG. 1, a storage system 100 is shown in which approaches for mitigation of read failures may be used according to the present disclosure. The storage system 100 includes a memory device 110 in operative electrical communication with a host device 120. The host device 120 may issue input/output (I/O) commands to the memory device 110. The I/O commands may include one or more read, write, or erase commands. The I/O commands may address one or more memory units 116a-116n of the memory device 110. The memory units 116a-116n may include one or more flash memory chips or portions of a given flash memory chip. For example, each memory unit 116a-116n may include at memory region including at least one flash memory die. A plurality of memory units 116a-116n are provided to achieve increased capacity. In this regard, any number of one or more memory units 116 may be provided without limitation as shown in FIG. 1.

The memory device 110 also includes an interface 112 to facilitate communication with the host device 120. The interface 112 may include address translation that may translate a logical address used by the host device 120 to a physical address in the memory units 116a-116n such that I/O commands from the host device 120 may be addressed to and performed on a given portion of the memory unit 116a-116n.

The memory device 110 may also include a controller 114. The controller 114 may receive the I/O commands from the host device 120. The controller 114 may in turn execute the I/O commands to perform an appropriate read, write, or erase command on the one or more memory units 116a-116n. The controller 114 may also perform one or more other memory control functions including, for example, caching, encryption, error detection and correction, garbage collection, wear leveling, and/or other memory functions. The controller 114 may also include a read error mitigation module 118. In various examples presented herein, the read error mitigation module 118 may detect read errors in the memory units 116a-116n and perform steps to mitigate the read failure of all or a portion of the memory units 116a-116n as will be discussed in greater detail below.

Figure 2:
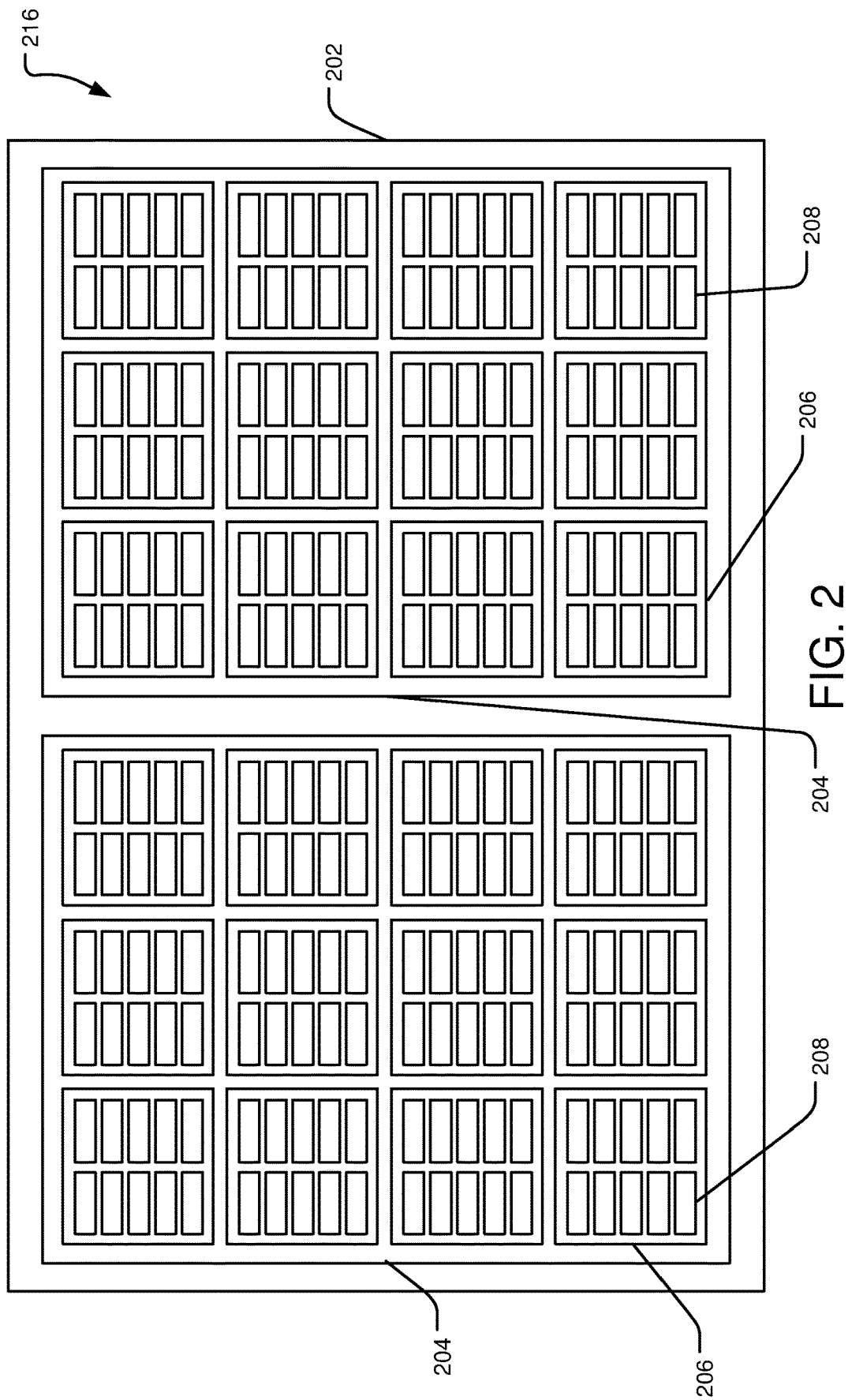
FIG. 2 depicts a schematic drawing of an example memory structure on which read error mitigation may be utilized.

The memory units 116a-116n of the memory device 110 may include any appropriate SSD memory structure including, for example, NAND memory, DRAM memory, HDD memory, Xpoint memory, or other appropriate memory structure. With further reference to FIG. 2, an example memory unit 216 is illustrated schematically. The memory unit 216 may include a hierarchical structure that includes a plurality of memory portions in a given memory region. Moreover, the memory portions and memory region may be arranged in increasing hierarchical level. For example, in the context of flash memory the memory portions may include cells, pages, blocks, and planes that are contained in a memory region comprising a die of the flash memory chip. In this regard, the memory unit 216 may include one or more memory regions (e.g., dies 202). A die 202 may include a plurality of planes 204. Each plane 204 may include a plurality of blocks 206. Each block 206 may include a plurality of pages 208. Each page 208 may include cells (not shown) capable of storage of one or more bits of data. A block 206 may be the smallest unit of memory that can be erased in the memory unit 216. In contrast, a page 208 may be the smallest unit of memory on which a read or write command may be performed. For example, pages may be between 0.5 KiB and 16 KiB in size. A block may comprise a grouping of pages that may include, for example, 16, 32, 64, 128, or more pages per block.

While the structure shown in FIG. 2 and described herein generally describes flash memory specific nomenclature and structure associated with flash memory, the present disclosure has equal applicability to any appropriate memory type with corresponding structure. Specifically, but without limitation, the present disclosure is applicable to a hard disk drive (HDD), NV-RAM, XPoint, or any other appropriate memory technology. Therefore, while memory portions may be referred to as pages, blocks, and dies, it may be appreciated that the approaches described herein may apply to any hierarchical memory structure of increasing size regardless of the nomenclature used to describe the hierarchy. That is, a memory unit 116 may include one or more memory regions (e.g., dies). Each memory region may include a plurality of first portions of memory (e.g., pages). A second memory portion (e.g., a block) may include a plurality of first memory portions. In addition, a memory region may include a plurality of second memory portions. Therefore, while reference below is made to pages, blocks, and dies, it will be appreciated that such terms may be interchangeable with first memory portions, second memory portions, and memory regions, respectively.

With returned reference to FIG. 1, the controller 114 may include a read error mitigation module 118. The read error mitigation module 118 may be operative to detect read errors in response to a failed read command of a memory unit 116. As may be appreciated, given a page may be the smallest unit of the memory on which a read operation may be performed, the read error mitigation module 118 may be operative to determine a read error on a page of memory. A read error on a page of memory may be a correctable read error or an uncorrectable read error. As used herein a correctable read error refers to an error in a read operation that may be corrected using an error correction code. For example, the controller 114 may be operative to apply an error correcting code to detect and/or correct errors in a read operation of a page. Any one of a number of error correction codes may be employed that may be able to detect and/or correct bit errors from the memory unit. However, any error correcting code used by the controller 114 may have a limited error correction capacity. In turn, if the number of errors in the read operation exceed the error correction capacity of the error correction code, the read error is an uncorrectable read error. In such cases, the uncorrectable read error may require use of data reconstruction (e.g., using RAID techniques that employ use of parity bits to reconstruct data lost due to the uncorrectable read error).

The read error mitigation module 118 of the controller 114 may be used to detect read errors in one or more portions of the one or more memory units 116a-116n. In turn, the read error mitigation module 118 may be operative to proactively retire a memory region that is deemed to be failing such that data from the failing memory region of a memory unit 116 may be migrated from the failing memory region. As such, data loss and/or the extensive use of data reconstruction may be avoided, thus providing increased data reliability and efficiency of the memory device 110. In addition to or as an alternative to any of the approaches described in greater detail below, individual portions of the memory unit may be determined to be defective or failing according to the disclosure provided in U.S. Pat. No. 10,453,547, the entirety of which is incorporated by reference herein.

While the read error mitigation module 118 may be operative to detect read errors, the example approaches described herein may be designed to restrict false positive detection of failing portions of a memory. That is, while an uncorrectable read error may be detected on a given page, the page may not repeatedly fail a read operation. As such, in one example approach for mitigation of read errors, a page on which an uncorrectable read error is detected may be identified as a suspect page. For example, the read error mitigation module 118 may maintain a suspect page list for a given block, plane, die, or memory unit 116 to identify memory portions in the suspect page list. If, after being identified as a suspect page, a subsequent successful read operation performed on the suspect page is detected, the suspect page may be removed from the suspect page list. In this regard, a degree of repeatability of the read error may be required to retire a portion of memory experiencing uncorrectable read errors.

Figure 3:
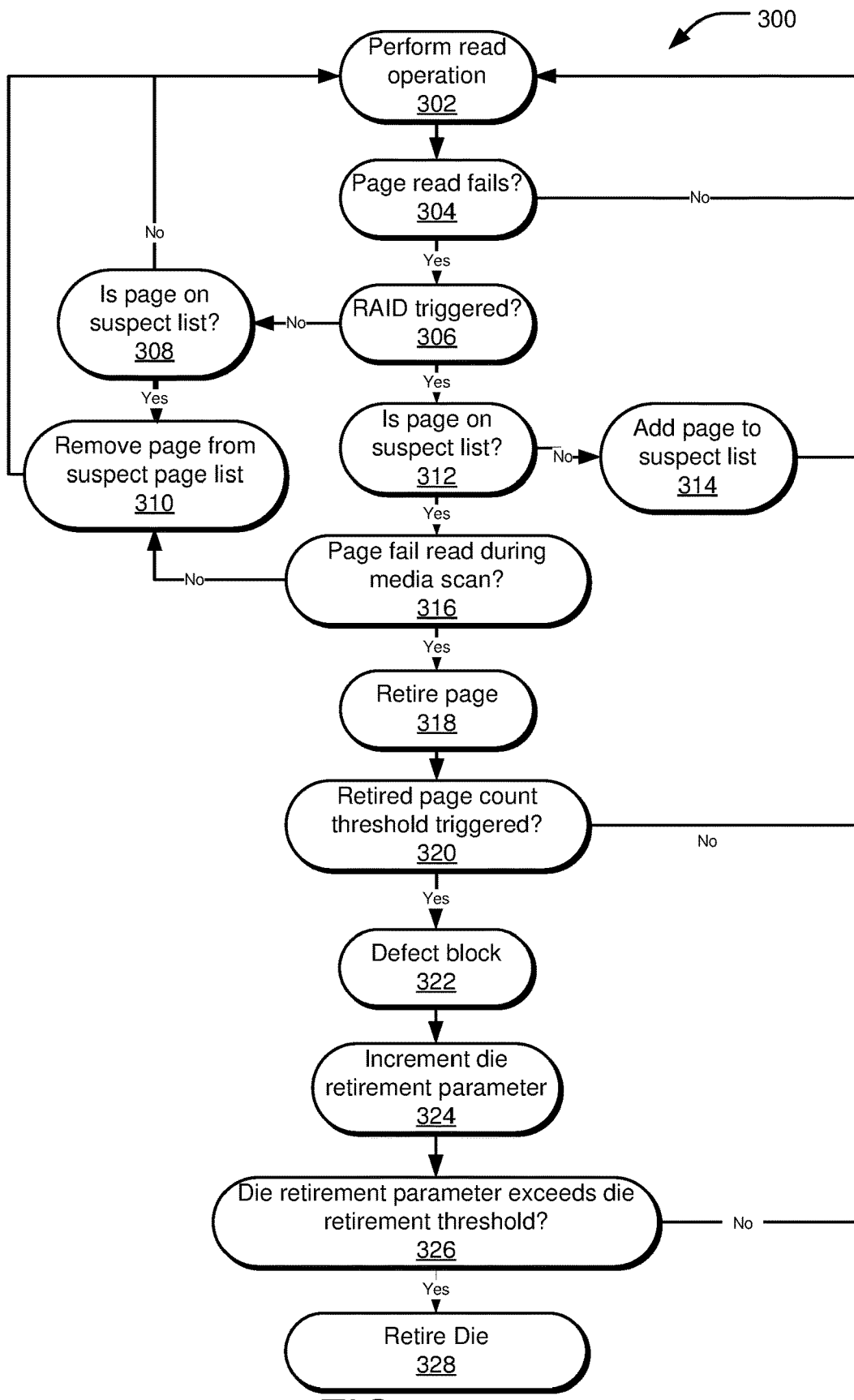
FIG. 3 depicts example operations of an approach for read error mitigation.

For example, in FIG. 3, example operations 300 are shown for operation of the read error mitigation module 118. The operations 300 include a read operation 302 that performs a read operation on a memory unit (e.g., a page of a memory unit). A detecting operation 304 detects if the page read failed, thus indicating a read error for the page that is the subject of the read operation 302. If no read error is detected for the page, the operations 300 return to the read operation 302 (e.g., a next I/O command for a memory device). If the detecting operation 304 detects that the page read of the read operation 302 failed, a RAID determination operation 306 determines if RAID was triggered by the read error detected at the detecting operation 304. That is, the RAID determination operation 306 may determine if the read error detected in the detecting operation 304 is an uncorrectable error. If RAID is not triggered, the read error detected at the detecting operation 304 may be deemed a correctable read error. In this case where a correctable read error occurs, a determining operation 308 determines if the page that incurred the correctable read error is on a suspect page list. If the page is not on the suspect page list, the operations 300 return to the read operation 302. However, if the page is on the suspect page list, a removing operation 310 removes the page from a suspect page list and the operations 300 return to the read operation 302.

If at the RAID determination operation 306, it is determined that the detected read error does trigger RAID, the read error is an uncorrectable read error. In this case, a determination operation 312 determines if the page is on a suspect page list. If the page is not on the suspect page list, an adding operation 314 adds the page that experienced the uncorrectable read error to the suspect page list and the operations 300 return to the read operation 302. If the page that experienced the uncorrectable read error is determined to be on the suspect page list, a scanning operation 316 may be triggered to perform a media scan of the failed page. If the media scan for the suspect page does not fail (e.g., the page is readable) during the scanning operation 316, the page may be removed from the suspect page list at the removing operation 310. If, however, the page read of the suspect page fails during the scanning operation 316, a page retiring operation 318 retires the suspect page. The page retiring operation 318 may include migrating the data from the retired page to one or more different memory locations and updating any associated mapping of the data to allow the data to be accessed at the relocated location. The page retiring operation 318 may also include marking the retired page as unavailable or unusable.

The operations 300 also includes determining whether to retire a memory region (e.g., die) based on a comparison of a memory retirement parameter to a memory retirement threshold to determine whether to retire a die of the memory. For example, the memory retirement parameter may be based on a number of retired portions of the memory in the die. This may include a retired first portion (e.g., page) count or a retired second portion (e.g., block) count for those respective memory portions within a given memory region (e.g., die). For example, in the depicted example in FIG. 3, for each block in the die, a comparing operation 320 determines if a retired page count for a block exceeds a retired page count threshold. The retired page count threshold may be a predetermined number of pages within a given die such that if the retired page count threshold is exceeded, the block may be retired. If at the comparing operation 320, the retired page count does not exceed the retired page count threshold, the operations 300 may return to a read operation 302 (e.g., a new read I/O command). If the retired page count threshold is exceeded by a retired page count of a block, an identifying step 322 may identify the block as defective. This may include merely identifying the block as defective and/or may include retiring the defective block. In the event of a block being identified as defective at the identifying step 322, a counting operation 324 may increment a memory retirement parameter for the die to which the defective block belongs. In turn, a comparing operation 326 may compare the memory retirement parameter to a memory retirement threshold to determine if the memory retirement parameter exceeds the memory retirement threshold.

In this regard, the memory retirement parameter and the memory retirement threshold may relate to a number of blocks that have been identified as defective for a given die. In other examples, the memory retirement parameter and the memory retirement threshold may be based on a number of retired pages of the die. In any regard, if the memory retirement parameter does not exceed the memory retirement threshold, the operations 300 may return to the read operation 302. If, however, the memory retirement parameter is determined in the comparing operation 326 to exceed the memory retirement threshold, a die retirement operation 328 may be performed. The die retiring operation 328 may include rewriting the data from the die to another memory location (e.g., another memory unit in a memory device) and updating any associated mapping of the data to allow the data to be accessed at the relocated location. The die retiring operation 328 may also include marking the die as unavailable or unusable.

The memory retirement parameter may additionally or alternatively include a read error rate. The read error rate may be at least in part based on a rate of read errors rather than solely a cumulative number of read errors over a life of a die. For instance, over the course of the life of a memory unit, even during nominal operations, the number of read errors will increase. Therefore, the read error rate may monitor a given number of read errors over a given time. The duration over which the read error rate is determined may be the entire life of the memory unit such that the read error rate includes the total number of read errors over the total number of reads. Alternatively, the total number of read errors over a shorter duration (e.g., including a sliding window) may be monitored to determine if the rate of read errors increases in a manner that indicates die failure. Accordingly, the memory retirement threshold may also relate to the read error rate. For instance, the memory retirement threshold may be a threshold percentage of the number of read errors per total reads. The memory retirement threshold may include a given rate over a given time period. Further still, the memory retirement threshold may be a given change over a number of subsequent monitored time periods such that the memory retirement parameter may include a maximum increase in the rate of read errors over the monitored time periods that exceed a given threshold. Further still, if a given number of successful reads occurs on a die, the memory retirement parameter may be reset to zero.

Figure 4:
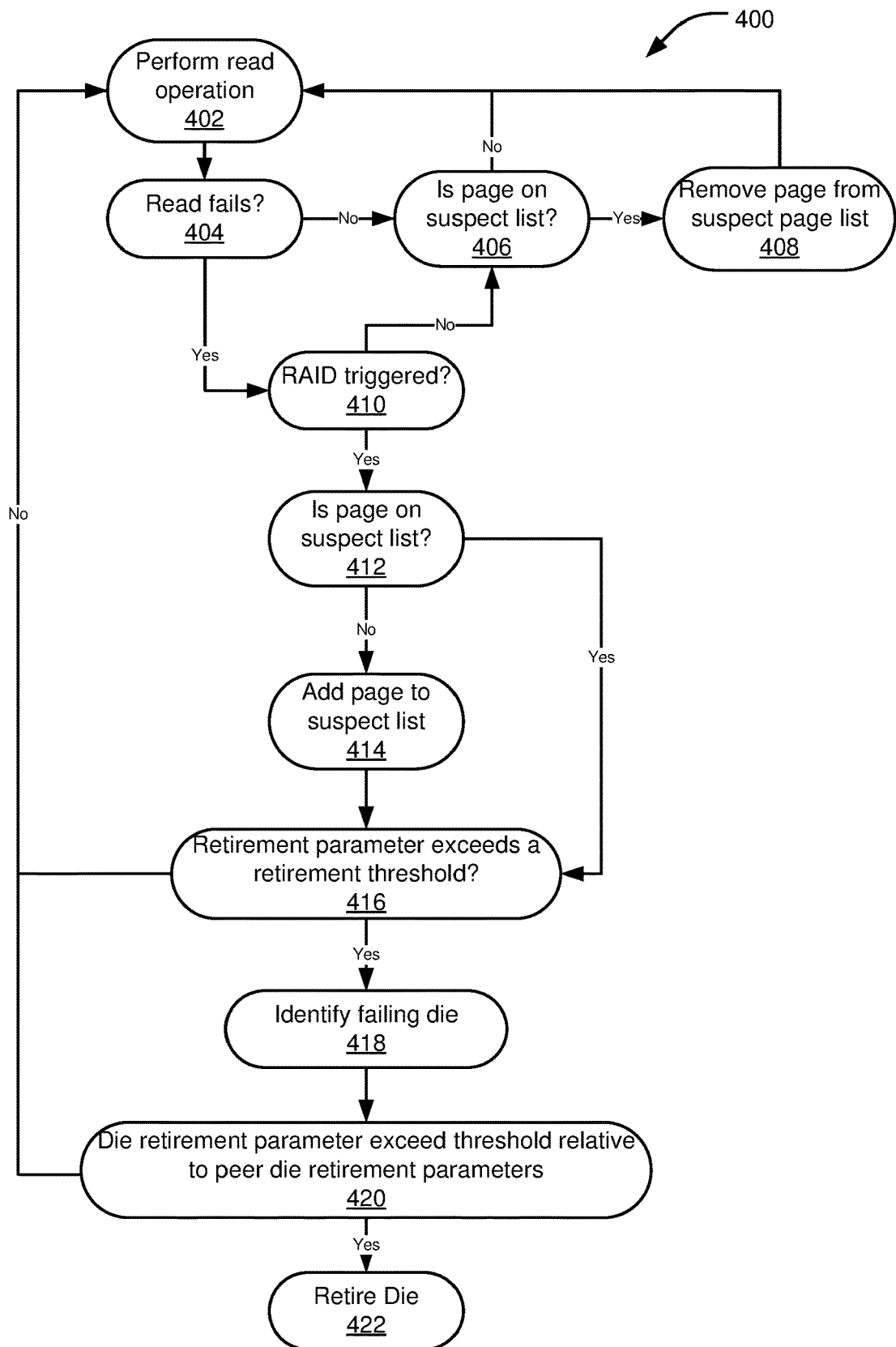
FIG. 4 depicts another example of operations of another approach for read error mitigation in which memory portions are compared to peer memory portions for determining failing portions of memory.

While the operations 300 depicted in FIG. 3 generally include use of a memory retirement threshold that includes a predetermined number of failures, in other approaches, the determination of whether to retire a die may be based on a comparison of a memory retirement parameter for a given die to corresponding peer memory retirement parameters of peer dies of a memory device. One example of operations that may be performed by the read error mitigation module 118 to retire a die based on relative performance to peer dies is depicted in FIG. 4.

The operations 400 include a read operation 402 that includes performing a read operation on a page a memory unit. A detecting operation 404 detects a read failure on the page as a result of the read operation 402. If no read error is detected at the detecting operation 404, a determining operation 406 determines if the page on which the read operation is preformed is on a suspect page list or otherwise identified as a suspect page. If it is determined that the page on which the read operation did not fail is on the suspect page list, a removing operation 408 removes the page for which a successful read operation is performed from the suspect page list. The operations 400 then return to the read operation 402 (e.g., to perform a subsequent I/O command). If the page on which a successful read operation is performed is not on the suspect page list the operations 400 also return to the read operation 402.

If a read failure is detected at the detecting operation 404, a RAID determination operation 410 determines if RAID is triggered by the read error. For example, if after detecting the read failure at the detecting operation 404, the read failure is corrected using an error correcting code, RAID may not be triggered. This scenario may correspond to a correctable read error. In turn, the determination operation 406 may determine if the page is on a suspect page list at a determination operation 406 as described above. In turn, if the page that experiences a correctable read error is on the suspect page list, the removing operation 408 may remove the page from the suspect page list. If, however, an error correction code is not able to correct the detected read error, RAID may be triggered as determined in the RAID determination operation 410. If the RAID determination operation 410 determines RAID has been triggered (i.e., an uncorrectable read error has occurred), a suspect determination operation 412 may determine if the page on which the read operation failed is on a suspect page list. If the page on which the read operation failed is not on the suspect page list, an adding operation 412 adds the page to a suspect page list.

Once the suspect determination operation 412 is executed to place a page on the suspect page list, or once it is confirmed that a page is already on the suspect page list, the operations 400 progress to a monitoring operation 414. In the monitoring operation 414, a die error parameter is monitored relative to a die performance threshold. If the die error parameter exceeds the die performance threshold, the die is identified as a failing die in an identifying operation 418. If, on the other hand, the die error parameter does not exceed the die performance threshold, the operations return to the reading operation 402. The die error parameter may be based on, for example, a number of blocks per die that require RAID processing in response to an uncorrectable read error and/or a number of pages per block per die that require RAID processing in response to an uncorrectable read error. In one embodiment, both a number of blocks per die that require RAID processing in response to an uncorrectable read error must exceed a block retirement threshold and/or a number of pages per block per die that require RAID processing in response to an uncorrectable read error must exceed a page retirement threshold for a die to be marked as failing.

Once a die has been identified as a failing die in the identifying operation 418, a determining operation 420 determines whether a memory retirement parameter satisfies a peer retirement threshold defined relative to memory retirement parameters of peer dies. If the memory retirement parameter for the failing die does not satisfy the peer threshold, the operations 400 return to the read operation 402. If the memory retirement parameter for the failing die does satisfy the peer threshold, a retirement operation 422 retires the failing die. The die retiring operation 422 may include rewriting the data from the die to another memory location (e.g., another memory unit in a memory device) and updating any associated mapping of the data to allow the data to be accessed at the relocated location. The die retiring operation 422 may also include marking the die as unavailable or unusable.

In an example, the die is retired if the memory retirement parameter is less than a minimum difference between a failing die and other peer dies. As described above, the memory retirement parameter may include a number of blocks per die requiring RAID processing in response to an uncorrectable read error and/or a number of pages per block per die requiring RAID processing in response to an uncorrectable read error. In this regard, a statistically significant departure for a die from the performance of peer dies as determined by the determining operation 420 may cause a die to be retired at the die retiring operation 422 (e.g., deviate from peer performance by greater than a given percentage).

The foregoing approaches that may be performed by read error mitigation module 118 generally relate to approaches that are performed in the course of completing I/O commands from a host device 120 to access the memory device 110 for performance of memory operations. That is, the detection of read errors in the foregoing approaches are in response to read operations requested by a host device 120 in the normal operation of a memory device 110. It may, however, be beneficial in at least some contexts to perform specific testing operations on the memory device 110 that are unrelated to the normal performance of the memory device 110. In this regard, the read error mitigation module 118 may be operative to place the memory device 110 (e.g., one or more of the memory units 116*a*-116*n*) in a testing state to perform a testing procedure on the memory. In turn, random or semi-random selections of memory portions may be chosen on which testing may be performed to test for read errors. Moreover, as the testing state is unrelated to regular memory operations, testing parameters may be established to provoke heightened scrutiny of the memory units 116. For example, an error correction capacity utilized in the testing state may be reduced relative to the error correction capacity during normal operations to more highly scrutinize the performance of the memory device 110. In turn, results of the heightened testing of the memory device 110 may be used to make determinations on whether to retire a portion of a memory unit 116.

Figure 5:
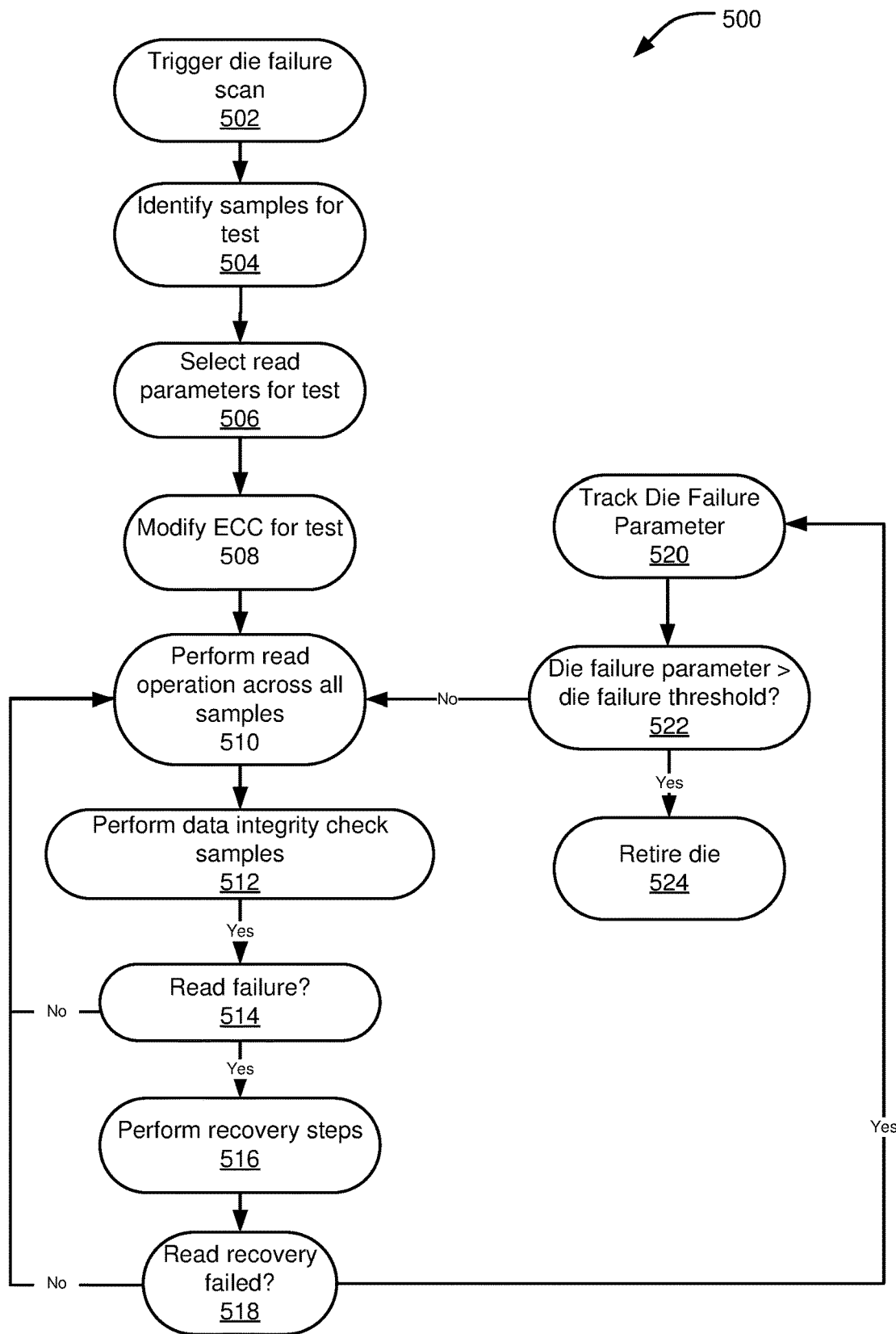
FIG. 5 depicts another example of operations of another approach for read error mitigation in which a memory is placed in a testing state to perform testing operations of memory portions.

One such approach that employs a testing procedure in a memory device is depicted as example operations 500 in FIG. 5. The operations 500 may include a triggering operation 502 in which a die failure scan is triggered. The triggering operation 502 may include placing a portion of the memory of a memory device (e.g., a portion of one or more memory units) into a testing state. An identifying operation 504 may select sample memory portions for subjects of the memory test. The identifying operation 504 may randomly or semi-randomly select portions of memory. Furthermore, the identifying operation 504 may include identifying die samples of a memory unit, block samples of the identified dies, and/or page samples from the identified blocks.

The operations 500 may also include a selecting operating 506 in which read parameters are selected for performing the read testing of the identified portions of memory. The read parameters may include selecting a calibrated read voltage value for each die in relation to performing an initial read of the die. The operations 500 may also include a modifying operation 508 in which the error correction capacity used for the read testing is modified from an operational error correction capacity to a testing error correction capacity. As described above, the testing error correction capacity may provide a reduced capacity to correct errors in the read operations relative to the operational error correction capacity. As such, read operations performed during the memory testing may more highly scrutinize the memory portions being tested by subjecting such read operations to more rigorous operational performance by reducing the error correction capability applied during the testing procedure of the memory.

In turn, the operations 500 include a reading operation 510 in which all of the identified memory samples from the identifying operation 504 are read using a read operation of the memory. A data integrity operation 512 may be performed on the results of the reading operation 510. Accordingly, a testing operation 514 may use the data integrity results to determine if a read failure occurred during the reading operation 510. If a read failure is not determined to have occurred, the process may iterate to the reading operation 510 until all identified memory samples have been read. If a failure is detected, a recovery operation 516 may be initiated in an attempt to recover the data from the failed memory portions. If read recover of the recovery operation 516 is successful, the process may iterate to the reading operation 510 until all identified memory samples have been read.

If read recovery fails in the recovery operation 516, the failed memory portions may be tracked in a tracking operation 520 as a read fail metric. Specifically, the read fail metric may include a number of failing blocks per die and/or a number of failing pages per block per die. A comparing operation 522 may compare the tracked read fail metric to an error threshold. If the read fail metric does not exceed the error threshold, the process may iterate to the reading operation 510 until all identified memory samples have been read. If, however, the read fail metric exceeds the error threshold, a retiring operation 524 may be performed to retire the die as described above.

While in this example the read fail metric and error threshold is based on a count of failing portions of the die (e.g., blocks and/or pages), other read fail metric can be used without limitation such as those described above in which the die failure parameter includes a performance measure defined relative to peer memory portions such that each portion of memory may be evaluated relative to peer portions to determine anomalous performance to trigger die retirement.

Figure 6:
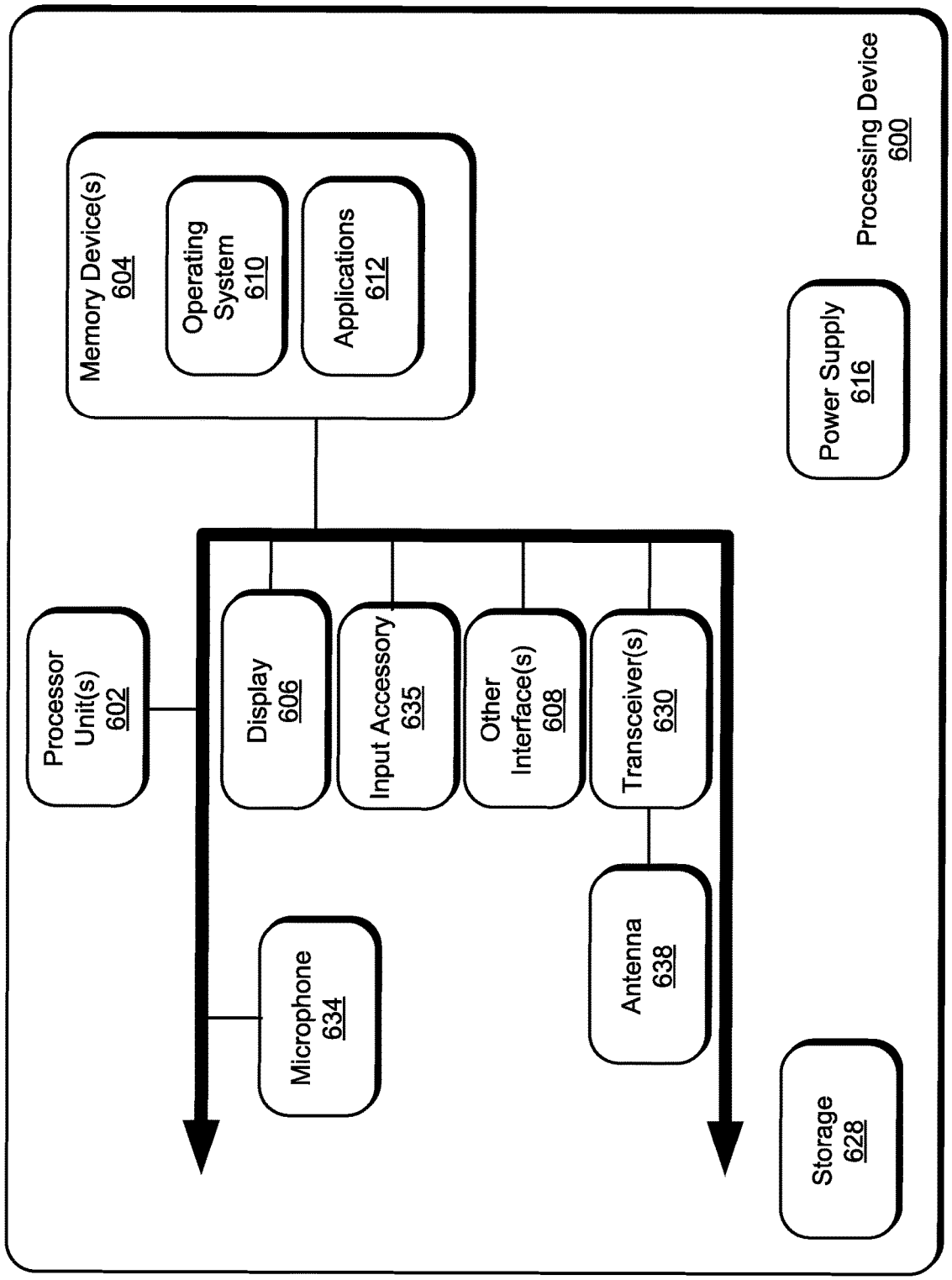
FIG. 6 depicts an example processing device that may be used to execute at least a portion of the present disclosure.

FIG. 6 illustrates an example schematic of a processing system 600 suitable for implementing aspects of the disclosed technology including a memory device 110 and/or a read error mitigation module 118 of a memory device 110 as described above. The processing system 600 includes one or more processor unit(s) 602, memory 604, a display 606, and other interfaces 608 (e.g., buttons). The memory 604 generally includes both volatile memory (e.g., RAM) and non-volatile memory (e.g., flash memory). An operating system 610, such as the Microsoft Windows® operating system, the Apple macOS operating system, or the Linux operating system, resides in the memory 604 and is executed by the processor unit(s) 602, although it should be understood that other operating systems may be employed.

One or more applications 612 are loaded in the memory 604 and executed on the operating system 610 by the processor unit(s) 602. Applications 612 may receive input from various input local devices such as a microphone 634, input accessory 635 (e.g., keypad, mouse, stylus, touchpad, joystick, instrument mounted input, or the like). Additionally, the applications 612 may receive input from one or more remote devices such as remotely-located smart devices by communicating with such devices over a wired or wireless network using more communication transceivers 630 and an antenna 638 to provide network connectivity (e.g., a mobile phone network, Wi-Fi®, Bluetooth®). The processing system 600 may also include various other components, such as a positioning system (e.g., a global positioning satellite transceiver), one or more accelerometers, one or more cameras, an audio interface (e.g., the microphone 634, an audio amplifier and speaker and/or audio jack), and storage devices 628. Other configurations may also be employed.

The processing system 600 further includes a power supply 616, which is powered by one or more batteries or other power sources and which provides power to other components of the processing system 600. The power supply 616 may also be connected to an external power source (not shown) that overrides or recharges the built-in batteries or other power sources.

In other examples, the read error mitigation module 118 may comprise an application-specific integrated circuit (ASIC), field programmable gate array (FPGA), or other combination of hardware, software, and/or firmware effective to execute the foregoing functionality described in relation to the read error mitigation module 118.

The processing system 600 may include a variety of tangible processor-readable storage media and intangible processor-readable communication signals. Tangible processor-readable storage can be embodied by any available media that can be accessed by the processing system 600 and includes both volatile and nonvolatile storage media, removable and non-removable storage media. Tangible processor-readable storage media excludes intangible communications signals and includes volatile and nonvolatile, removable and non-removable storage media implemented in any method or technology for storage of information such as processor-readable instructions, data structures, program modules or other data. Tangible processor-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the processing system 600. In contrast to tangible processor-readable storage media, intangible processor-readable communication signals may embody processor-readable instructions, data structures, program modules or other data resident in a modulated data signal, such as a carrier wave or other signal transport mechanism. The term "modulated data signal" means an intangible communications signal that has one or more of its characteristics set or changed in such a manner as to encode information in the signal. By way of example, and not limitation, intangible communication signals include signals traveling through wired media such as a wired network or direct-wired connection, and wireless media such as acoustic, RF, infrared, and other wireless media.

Some implementations may comprise an article of manufacture. An article of manufacture may comprise a tangible storage medium to store logic. Examples of a storage medium may include one or more types of processor-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, operation segments, methods, procedures, software interfaces, application program interfaces (API), instruction sets, computing code, computer code, code segments, computer code segments, words, values, symbols, or any combination thereof. In one implementation, for example, an article of manufacture may store executable computer program instructions that, when executed by a computer, cause the computer to perform methods and/or operations in accordance with the described implementations. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain operation segment. The instructions may be implemented using any suitable high-level, low-level, object-oriented, visual, compiled and/or interpreted programming language.

One general aspect of the present disclosure includes a method for testing for read failures in a solid-state memory device. The method includes initiating a test procedure on a memory region of the solid-state memory device in response to a trigger and modifying an error correction capability of the solid-state memory device from an operational error correction capability to a test error correction capability. The method also includes detecting an uncorrectable read error on a first memory portion of the memory region, where the uncorrectable read error is based on the test error correction capability. The method also includes tracking a region read fail metric based on the uncorrectable read errors per memory region, comparing the region read fail metric to an error threshold, and determining whether to retire the memory region based on the region read fail metric in relation to the error threshold.

Implementations may include one or more of the following features. In an example, the initiating operation includes cessation of memory read operation from a host device. In this regard, the uncorrectable read error may be in response to a test read operation performed on one or more first memory portions of the memory region.

In an example, the test error correction capability includes a reduced error correction capability relative to the operational error correction capability.

In an example, the region read fail metric comprises a number of failing second memory portions per memory region. Each second memory portion includes a plurality of first memory portions and the memory region includes a plurality of second memory portions. The region read fail metric may include a number of failing first memory portions per second memory portion of the memory region.

In another example, the method includes retiring the memory region based on the determining operation. In an example, the trigger comprises a periodic trigger. In another example, the trigger comprises an error recovery attempt event of the memory region.

Another general aspect of the present disclosure includes a solid-state memory device for mitigation of memory read errors. The device includes one or more memory units comprising at least one memory region. The at least one memory region has a plurality of second memory portions each having a plurality of first memory portions for storage of data in the memory unit. The device also includes a read error mitigation module. The read error mitigation module is operative to initiate a test procedure on a memory region of the solid-state memory device in response to a trigger. In addition, the read error mitigation module modifies an error correction capability of the solid-state memory device from an operational error correction capability to a test error correction capability and detects an uncorrectable read error of a first memory portion in the memory region based on the test error correction capability. The read error mitigation module is also operative to track a region read fail metric based on the uncorrectable read errors per memory region and compare the region read fail metric to an error threshold. In turn, the read error mitigation module determines whether to retire the memory region based on the region read fail metric exceeding the error threshold.

Implementations may include one or more of the following features. In an example the initiation of the test procedure may include cessation of memory read operation from a host device. The test error correction capability may include a reduced error correction capability relative to the operational error correction capability.

In an example, the region failure metric includes a number of failing second memory portions per memory portion and a number of failing first memory portions per second memory portion and the read error mitigation module is operative to retire the memory region based on the read error mitigation module determining the region failure metric exceeds the error threshold. The trigger may include a periodic trigger.

Another general aspect of the present disclosure includes one or more tangible processor-readable storage media embodied with instructions for executing on one or more processors and circuits of a memory device a process for read error mitigation. The process includes initiating a test procedure on a memory region of the solid-state memory device in response to a trigger and modifying an error correction capability of the solid-state memory device from an operational error correction capability to a test error correction capability. The process also includes detecting an uncorrectable read error on a first memory portion of the memory region based on the test error correction capability. The process further includes tracking a region failure metric based on the uncorrectable read errors per memory region. In turn, the process includes comparing the region read fail metric to an error threshold and determining whether to retire the memory region based on the region read fail metric in relation to the error threshold.

Implementations may include one or more of the following features. In an example the initiating operation may include cessation of memory read operation from a host device. Additionally, the test error correction capability may include a reduced error correction capability relative to the operational error correction capability.

In an example of the one or more tangible processor-readable storage media, the region read fail metric includes a number of failing second memory portions per memory region and a number of failing first memory portions per second memory portion of the memory region. The trigger may comprise a periodic trigger.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language.

What is claimed is:

1. A method for testing for read failures in a solid-state memory device, the method comprising:
    initiating a test procedure on a memory region of the solid-state memory device in response to a trigger;
    modifying an error correction capability of the solid-state memory device from an operational error correction capability to a test error correction capability;
    detecting an uncorrectable read error on a first memory portion of the memory region, the uncorrectable read error being based on the test error correction capability;
    tracking a region read fail metric based on the uncorrectable read errors per memory region;
    comparing the region read fail metric to an error threshold; and
    determining whether to retire the memory region based on the region read fail metric in relation to the error threshold.

2. The method of claim 1, wherein the initiating operation includes cessation of memory read operation from a host device.

3. The method of claim 2, wherein the uncorrectable read error is in response to a test read operation performed on one or more first memory portions of the memory region.

4. The method of claim 1, wherein the test error correction capability comprises a reduced error correction capability relative to the operational error correction capability.

5. The method of claim 1, wherein the region read fail metric comprises a number of failing second memory portions per memory region, each second memory portion comprising a plurality of first memory portions and the memory region comprising a plurality of second memory portions.

6. The method of claim 5, wherein the region read fail metric comprises a number of failing first memory portions per second memory portion of the memory region.

7. The method of claim 1, further comprising:
    retiring the memory region based on the determining operation.

8. The method of claim 1, wherein the trigger comprises a periodic trigger.

9. The method of claim 1, wherein the trigger comprises an error recovery attempt event of the memory region.

10. A solid-state memory device for mitigation of memory read errors, comprising:
    one or more memory units comprising at least one memory region, the at least one memory region having a plurality of second memory portions each having a plurality of first memory portions for storage of data in the memory unit;
    a read error mitigation module operative to:
        initiate a test procedure on a memory region of the solid-state memory device in response to a trigger;
        modify an error correction capability of the solid-state memory device from an operational error correction capability to a test error correction capability;
        detect an uncorrectable read error of a first memory portion in the memory region based on the test error correction capability;
        track a region read fail metric based on the uncorrectable read errors per memory region;
        compare the region read fail metric to an error threshold; and
        determine whether to retire the memory region based on the region read fail metric exceeding the error threshold.

11. The memory device of claim 10, wherein the initiation of the test procedure includes cessation of memory read operation from a host device.

12. The memory device of claim 10, wherein the test error correction capability comprises a reduced error correction capability relative to the operational error correction capability.

13. The memory device of claim 10, wherein the region read fail metric comprises a number of failing second memory portions per memory region and a number of failing first memory portions per second memory portion.

14. The memory device of claim 10, further comprising:
    retiring the memory region based on the read error mitigation module determining the region read fail metric exceeds the error threshold.

15. The memory device of claim 10, wherein the trigger comprises a periodic trigger.

16. One or more tangible processor-readable storage media embodied with instructions for executing on one or more processors and circuits of a memory device a process for read error mitigation comprising:
    initiating a test procedure on a memory region of a memory unit in response to a trigger;
    modifying an error correction capability of the memory unit from an operational error correction capability to a test error correction capability;
    detecting an uncorrectable read error on a first memory portion of the memory region based on the test error correction capability;
    tracking a region failure metric based on the uncorrectable read errors per memory region;
    comparing the region read fail metric to an error threshold; and
    determining whether to retire the memory region based on the region read fail metric in relation to the error threshold.

17. The one or more tangible processor-readable storage media of claim 16, wherein the initiating operation includes cessation of memory read operation from a host device.

18. The one or more tangible processor-readable storage media of 16, wherein the test error correction capability comprises a reduced error correction capability relative to the operational error correction capability.

19. The one or more tangible processor-readable storage media of claim 16, wherein the region read fail metric comprises a number of failing second memory portions per memory region and a number of failing first memory portions per second memory portion of the memory region.

20. The one or more tangible processor-readable storage media of claim 16, wherein the trigger comprises a periodic trigger.

\* \* \* \* \*